United States Patent [19]

Yamada et al.

[11] 4,109,456
[45] Aug. 29, 1978

[54] CERAMIC CAPACITOR

[75] Inventors: Kuniharu Yamada; Katsuhiro Teraishi, both of Suwa, Japan

[73] Assignee: Kabushiki Kaisha Suwa Seikosha, Tokyo, Japan

[21] Appl. No.: 593,343

[22] Filed: Jul. 7, 1975

Related U.S. Application Data

[63] Continuation-in-part of Ser. No. 472,012, May 21, 1974, abandoned.

[30] Foreign Application Priority Data

May 21, 1973 [JP] Japan ............................ 48-56568

[51] Int. Cl.² .......................................... G04C 3/00
[52] U.S. Cl. .............................. 58/23 AC; 106/73.3; 361/282; 361/301
[58] Field of Search ............... 106/73.3, 73.31, 39.5; 58/23 R, 23 AC; 331/116 R, 116 M, 176; 317/248, 258

[56] References Cited

U.S. PATENT DOCUMENTS

| | | | |
|---|---|---|---|
| 2,695,239 | 11/1954 | Oshry | 106/73.31 |
| 2,972,570 | 2/1961 | Haas et al. | 106/39.5 X |
| 3,221,228 | 11/1965 | Carter et al. | 317/258 |
| 3,345,189 | 10/1967 | Fujiwara et al. | 106/73.31 |
| 3,568,093 | 3/1971 | Ishida et al. | 58/23 AC |
| 3,609,483 | 9/1971 | Smyly | 317/258 |
| 3,728,641 | 4/1973 | Fujita et al. | 317/248 |

*Primary Examiner*—Ulysses Weldon
*Attorney, Agent, or Firm*—Blum, Moscovitz, Friedman & Kaplan

[57] ABSTRACT

A ceramic capacitor operatively connected to a piezoelectric oscillator for compensating for the temperature dependence of the oscillator frequency is provided for thereby optimizing the accuracy of an electronic timepiece.

5 Claims, 3 Drawing Figures

CERAMIC CAPACITOR

CROSS REFERENCE TO RELATED APPLICATION

This application is a continuation-in-part of our co-pending application Ser. No. 472,012 for Electronic Timepiece, filed May 21, 1974 now abandoned.

BACKGROUND OF THE INVENTION

This invention relates to an electronic timepiece having optimal long-term accuracy. More particularly, the invention relates to a ceramic capacitor operatively connected to the timepiece oscillator which minimizes daily time lag or forward variances from an accurate time standard.

In general, electronic timepieces of the type including a pieozoelectric oscillator exhibit severe temperature dependence. The daily time variance generated by temperature fluctuations as compared to an accurate standard may be as much as 1 to 2 seconds per day under average use conditions. Some means for compensating for the temperature dependence of the oscillator must be employed if it is desired to optimize the accuracy of the timepiece.

Accordingly, the instant invention provides means for improving the accuracy of electronic timepieces of the type including a piezoelectric oscillator.

SUMMARY OF THE INVENTION

Generally speaking, in accordance with the invention, an electronic timepiece of the type including a conventional piezoelectric oscillator is provided with means for compensating for the temperature dependence of the frequency thereof. The means selectively control the capacity of the oscillator between predetermined limits.

Accordingly, it is an object of this invention to provide an electronic timepiece having optimal accuracy.

Another object of the invention is to provide means for compensating for the temperature dependence of a piezoelectric oscillator of the type conventionally employed in an electronic timepiece.

A further object of the invention is to minimize the temperature dependence of a standard piezoelectric oscillator by controlling the capacity thereof between predetermined upper and lower limits.

A further object of the invention is to provide a ceramic capacitor which is operatively connected to a conventional piezoelectric oscillator in a timepiece for compensating for the temperature dependence thereof for thereby optimizing the accuracy of the timepiece.

Still other objects and advantages of the invention will, in part, be obvious and will, in part, be apparent from the specification.

The invention accordingly comprises the features of construction, combinations of elements and arrangement of parts which will be exemplified in the constructions hereinafter set forth and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

A conventional quartz oscillator fabricated according to any typical cut system, excluding the AT-cut and GT-cut systems, typically has a temperature-frequency curve of the second degree. To compensate for the temperature dependence of the frequency of such quartz oscillators, it has now been found that a capacitor having a Curie point substantially equal to the vertex of the temperature-frequency curve of the quartz oscillator and a temperature-capacity curve substantially the same as the temperature-frequency curve of the quartz oscillator should be operatively connected in the oscillator circuit.

Surprisingly, a capacitor of the barium titanate type may be employed. In general, it has been impractical to employ capacitors of this type in the past because of their typically poor temperature dependence. In general, the Curie point of the barium titanate type capacitor is determined at ambient temperature and simultaneously therewith, the capacity rate change thereof is measured. The capacitor may thereafter be operatively connected to a typical piezoelectric oscillator having a substantially zero temperature coefficient at ambient temperature.

Preferably the capacitor employed is a ceramic comprising an admixture of $BaSnO_3$ and $BaTiO_3$. Most preferably, the $BaSnO_3$ and $BaTiO_3$ admixture is at least 90 mol % of the ceramic composition. Up to 10 mol % of two distinct groups of oxides must be added to the ceramic composition for fabricating a capacitor having compensating effects within the scope of this invention. Suitable oxides within the first group include titanates, particularly, $SrTiO_3$, $CaTiO_3$ and $MgTiO_3$; and $CaSnO_3$. Suitable oxides within the second group that may be employed include $SiO_2$, $Fe_2O_3$, $MnO_2$, $CoO$, $V_2O_5$ and $CeO_2$. The ceramic in the capacitor contains at least one of the suitable oxides of each of the two groups in addition to the $BaSnO_3$ - $BaTiO_3$ admixture.

It is a critical aspect of the invention that the capacitor employed have a change-rate of 30% and preferably higher. Ceramic capacitors within the scope of this invention have a compensation characteristic of 30% and more.

Figure 1:
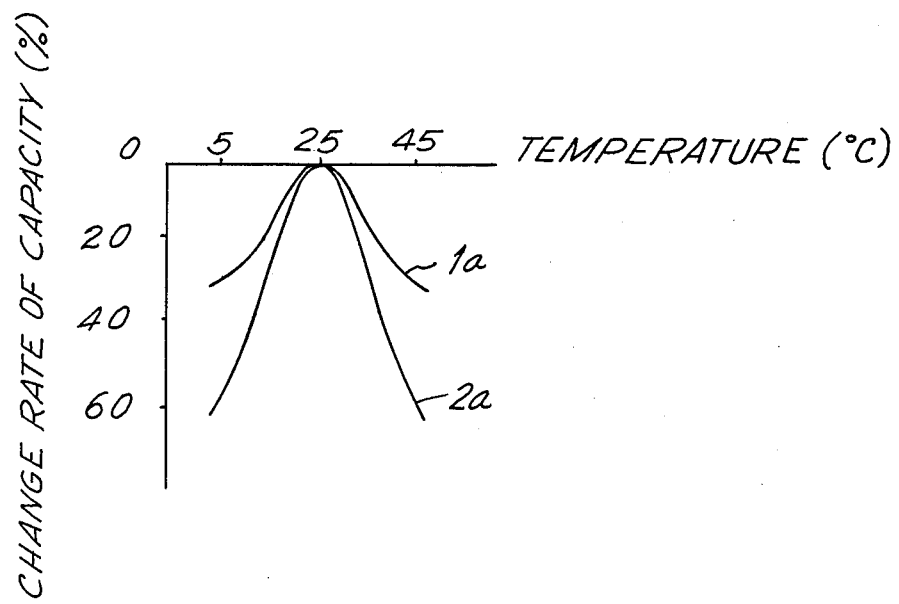
FIG. 1 is a graphic example of the temperature-capacity curve of a capacitor constructed in accordance with the invention.
Figure 2:
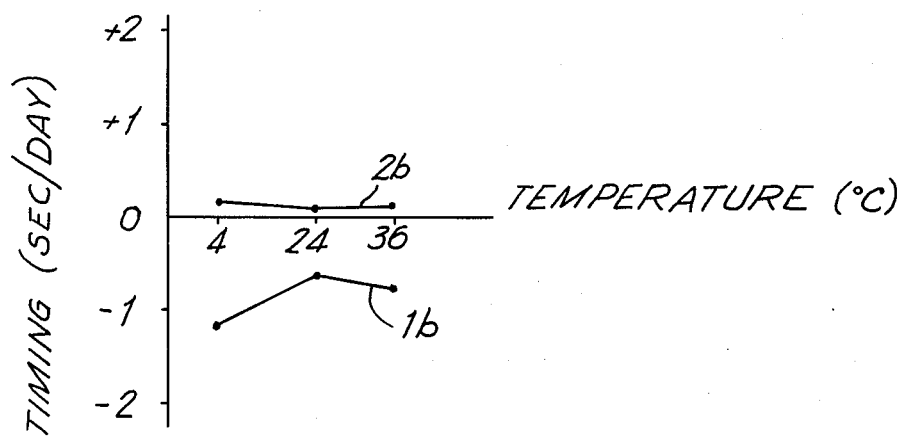
FIG. 2 is a graphic example depicting the influence of the rate change of the capacity of a capacitor constructed in accordance with the invention upon the accuracy of an electronic timepiece.

Referring now to FIGS. 1 and 2, it may be observed that a capacitor having a small capacity change-rate of about less than 30%, has a less than satisfactory compensatory effect upon the oscillator. The less than satisfactory performance may be observed by comparing the graph line generally labeled 1a of FIG. 1 with the graph line generally designated 1b of FIG. 2. The satisfactory compensatory performance of capacitors having an effective capacity change-rate may be observed by comparing the graph line generally designated 2a of FIG. 1 with the graph line generally designated 2b of FIG. 2. The capacitor employed in making these last mentioned graph determinations had a capacity change-rate of at least 30% and the satisfactory compensation effect thereof on the oscillator is particularly shown with reference to graph line 2b of FIG. 2.

In the specification, claims and examples which follow, the "change-rate" which has been referred to is defined as follows:

$$\text{change rate} = \frac{C_0 - C_1}{C_0} \times 100\ (\%)$$

where, $C_0$ is a capacity at Curie point.

$C_1$ is a capacity at 20° C lower than Curie point or at 20° C higher than Curie point.

The capacity change-rate of a given capacitor is functionally related to temperature variation, and while there is random correlation between change-rate and temperature, it is an important aspect of the invention that the change-rate of the capacitor be at least 30% and preferably from about 40 to about 80% at C ± 20° C for the capacitor, where C is the Curie point. Optimum results occur where the capacity change-rate is from about 60 to about 80% in that temperature range.

Figure 3:
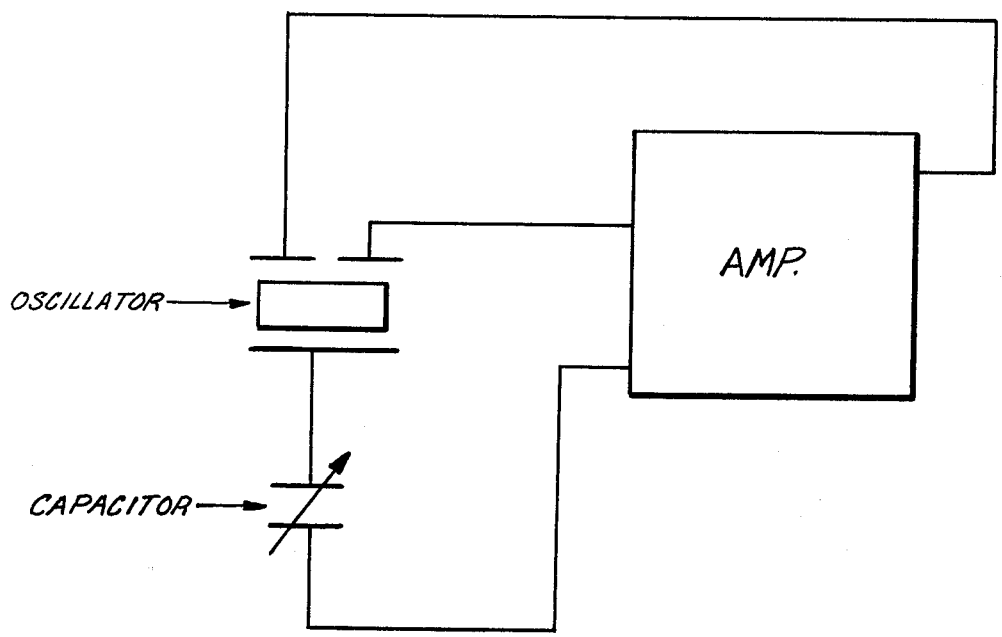
FIG. 3 is a schematic representation of a capacitor within the scope of the invention in circuit with an oscillator in an electronic timepiece.

The following examples are set forth for illustrative purposes only, and it is not intended that the invention be limited thereby, except as it may be limited in the claims. The examples below illustrate advantages of the invention and the data collected therein illustrates the compensatory effect of employing a ceramic capacitor of the type herein described in operative connection with various conventional piezoelectric oscillators, as may be seen in FIG. 3. In each example, a crystal oscillator of predetermined characteristics was employed and the influence of the capacitor thereon was observed and recorded. In each example, TC is defined as the Curie point of the capacitor or the vertex of the temperature-frequency curve of the oscillator.

EXAMPLE 1

| condition of oscillator | X-cut −5° tuning fork type resonance frequency 16KHz |
|---|---|
| TC of oscillator | 25° C |
| TC of capacitor | 24.5° C |

| TC± 20° C change rate (%) of capacitor | 20 | 40 | 60 | 80 |
|---|---|---|---|---|
| timing (sec/day) | −1.20 | −0.37 | +0.08 | +0.09 |

EXAMPLE 2

| condition of oscillator | X-cut −4.5° tuning fork type resonance frequency 16KHz |
|---|---|
| TC of oscillator | 23.5° C |
| TC of capacitor | 23° C |

| TC± 20° C change rate (%) of capacitor | 20 | 40 | 60 | 80 |
|---|---|---|---|---|
| timing (sec/day) | −1.18 | −0.36 | +0.10 | +0.08 |

EXAMPLE 3

| condition of oscillator | NT-cut −5° −74° leaf type resonance frequency 32 KHz |
|---|---|
| TC of oscillator | 25° C |
| TC of capacitor | 24.5° C |

| TC± 20° C change rate (%) of capacitor | 20 | 40 | 60 | 80 |
|---|---|---|---|---|
| timing (sec/day) | −2.53 | −0.52 | +0.07 | +0.08 |

Comparison of the data collected for the above examples illustrates that there is no satisfactory compensation for oscillator variance when the capacitor change-rate is less than about 30% in the designated temperature range. It may be observed that where a leaf-type quartz oscillator of the type employed in Example 3 is utilized, the compensatory effect of the capacitor is generally small, unless the capacitor change-rate is commensurately large. While quartz crystal oscillators of the tuning fork and leaf types were employed for the purpose of accumulating data for the examples, the same satisfactory effect may be obtained when other quartz crystal oscillators, for instance, of the free-free-bar flexural type are utilized. Although X-cut and NT-cut type quartz crystal oscillators were employed in the examples, other quartz crystal oscillators cut by different methods may be utilized so long as the temperature-frequency curve thereof is substantially of the second degree. It is, however, to be noted that AT-cut and GT-cut quartz crystal oscillators may not be employed in connection with the invention.

The following examples illustrate representative ceramic compositions for capacitors within the scope of the invention:

EXAMPLE 4

| $BaTiO_3$ | 80.7 mol % | |
|---|---|---|
| $BaSnO_3$ | 12.0 | |
| $CaTiO_3$ | 7.0 | Curie point: 23 to 28° C |
| $MnO_2$ | 0.3 | Change-rate at Curie point ± 20° C: 33 to 48% |

EXAMPLE 5

| $BaTiO_3$ | 83.0 mol % | |
|---|---|---|
| $BaSnO_3$ | 10.0 | |
| $CaSnO_3$ | 4.0 | Curie point: 26 to 32° C: |
| $SrTiO_3$ | 2.5 | Change-rate at Curie point ± 20° C: |
| $Fe_2O_3$ | 0.3 | 40 to 55% |
| $V_2O_5$ | 0.2 | |

EXAMPLE 6

| $BaTiO_3$ | 84.0 mol % | |
|---|---|---|
| $BaSnO_3$ | 14.0 | |
| $MgTiO_3$ | 1.7 | Curie point: 20 to 26° C |
| $SiO_2$ | 0.2 | Change-rate at Curie point ± 20° C: |
| $CoO$ | 0.1 | 50 to 62% |

The following examples illustrate ceramic compositions for capacitors, but these compositions are outside the scope of the invention, although components of the compositions are individually suitable for the ceramic. Each of the capacitors has an unsuitably low change-rate.

EXAMPLE 7

| $BaTiO_3$ | 70.0 mol % | |
|---|---|---|
| $BaSnO_3$ | 9.5 | |
| $CaTiO_3$ | 15.0 | Curie point: 22 to 28° C |
| $MgTiO_3$ | 5.0 | Change-rate at Curie point ± 20° C: |
| $MnO_2$ | 0.3 | 15 to 26% |
| $CoO$ | 0.2 | |

EXAMPLE 8

| $BaTiO_3$ | 68.0 mol % | |
|---|---|---|
| $BaSnO_3$ | 7.0 | Curie point: 18 to 22° C |
| $CaSnO_3$ | 20.0 | Change-rate at Curie point ± 20° C: |
| $SrTiO_3$ | 4.5 | 10 to 24% |

| | |
|---|---|
| -continued | |
| $Al_2O_3$ | 0.5 |

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An improved temperature compensating capacitor comprising a ceramic including at least 90 mol % of an admixture of $BaTiO_3$ and $BaSnO_3$, the content of $BaTiO_3$ lying between 80.7 and 84.0 mol % and the content of $BaSnO_3$ lying between 10.0 and 14.0 mol %, and the remainder of the ceramic composition containing at least one oxide selected from a first group consisting of $SrTiO_3$, $CaSnO_3$, $CaTiO_3$ and $MgTiO_3$ in an amount from 1.7 to 7.0 mol % and at least one oxide selected from a second group consisting of $SiO_2$, $Fe_2O_3$, $MnO_2$, $CoO$, $V_2O_5$ and $CeO_2$ in an amount from 0.3 to 0.5 mol %, said capacitor having a Curie point lying within the ambient temperature range and having a change-rate of at least 30% between its Curie point and its Curie point $\pm$ 20° C, wherein the change-rate of said capacitor is defined as $$\frac{C_0 - C_1}{C_0} \times 100\%,$$

$C_0$ being the capacity of said capacitor at its Curie point, and $C_1$ being the capacity of said capacitor at its Curie $\pm$ 20° C.

2. The capacitor as claimed in claim 1, including in operative combination therewith, a piezoelectric oscillator subject to time variance as a function of temperature, and circuit means providing operative connection between said capacitor and said oscillator.

3. An improved temperature compensating capacitor comprising a ceramic consisting essentially of 80.7 mol % $BaTiO_3$, 12.0 mol % $BaSnO_3$, 7.0 mol % $CaTiO_3$, and 0.3 mol % $MnO_2$.

4. An improved temperature compensating capacitor comprising a ceramic consisting essentially of 83.0 mol % $BaTiO_3$, 10.0 mol % $BaSnO_3$, 4.0 mol % $CaSnO_3$, 2.5 mol % $SrTiO_3$, 0.3 mol % $Fe_2O_3$, and 0.2 mol % $V_2O_5$.

5. An improved temperature compensating capacitor comprising a ceramic consisting essentially of 84.0 mol % $BaTiO_3$, 14.0 mol % $BaSnO_3$, 1.7 mol % $MgTiO_3$, 0.2 mol $SiO_2$, and 0.1 mol % $CoO$.

* * * * *